United States Patent
Kim et al.

(10) Patent No.: US 11,424,003 B2
(45) Date of Patent: Aug. 23, 2022

(54) MEMORY CONTROLLERS HAVING SIMPLIFIED BISR LOGIC CIRCUIT, METHODS OF OPERATING THE MEMORY CONTROLLER, AND MEMORY SYSTEMS INCLUDING THE MEMORY CONTROLLER

(71) Applicant: SK hynix Inc., Icheon-si (KR)

(72) Inventors: Bo Ra Kim, Icheon-si (KR); Su Hae Woo, Icheon-si (KR); Jae Il Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/203,605

(22) Filed: Mar. 16, 2021

(65) Prior Publication Data

US 2022/0101941 A1     Mar. 31, 2022

(30) Foreign Application Priority Data

Sep. 28, 2020   (KR) .................. KR10-2020-0126404

(51) Int. Cl.
*G11C 29/44* (2006.01)
*G11C 29/42* (2006.01)
*G11C 29/14* (2006.01)
*G11C 29/36* (2006.01)

(52) U.S. Cl.
CPC .............. *G11C 29/44* (2013.01); *G11C 29/14* (2013.01); *G11C 29/36* (2013.01); *G11C 29/42* (2013.01); *G11C 2029/4402* (2013.01)

(58) Field of Classification Search
CPC ......... G11C 29/44; G11C 29/14; G11C 29/36; G11C 29/42
See application file for complete search history.

(56) References Cited

U.S. PATENT DOCUMENTS

| | | | |
|---|---|---|---|
| 7,415,641 B1 | 8/2008 | Behera et al. | |
| 8,988,956 B2 * | 3/2015 | Chopra | G11C 29/04 365/201 |
| 2013/0173970 A1 * | 7/2013 | Kleveland | G11C 29/808 714/710 |
| 2020/0395093 A1 * | 12/2020 | Kang | G11C 29/18 |
| 2021/0375385 A1 * | 12/2021 | Chiang | G11C 29/44 |

* cited by examiner

*Primary Examiner* — Tuan T Nguyen
(74) *Attorney, Agent, or Firm* — William Park & Associates Ltd.

(57) ABSTRACT

A memory controller includes a core processor and a built-in self-repair (BISR) logic circuit. The core processor includes a register file with a plurality of register values corresponding to repair commands that control a self-repair operation of a memory device. The BISR logic circuit receives at least one of the plurality of register values from the core processor and converts the at least one of the plurality of register values into at least one of the repair commands to output the least one of the repair commands to the memory device. The core processor transmits the at least one of the plurality of register values to the BISR logic circuit in response to a firmware instruction that is output from an external firmware coupled to the memory controller.

19 Claims, 15 Drawing Sheets

MEMORY CONTROLLERS HAVING SIMPLIFIED BISR LOGIC CIRCUIT, METHODS OF OPERATING THE MEMORY CONTROLLER, AND MEMORY SYSTEMS INCLUDING THE MEMORY CONTROLLER

CROSS-REFERENCE TO RELATED APPLICATIONS

The present application claims priority under 35 U.S.C. 119(a) to Korean Application No. 10-2020-0126404, filed on Sep. 28, 2020, which is incorporated herein by references in its entirety.

BACKGROUND

1. Technical Field

Various embodiments of the present teaching relate to memory systems and, more particularly, to memory controllers with a simplified built-in self-repair (BISR) logic circuit, methods of operating the memory controller, and memory systems including the memory controller.

2. Related Art

As semiconductor technologies are developed, high performance memory devices with a large storage capacity have been produced. Recently, in mass production of memory devices, various repair techniques for replacing faulty cells (also, referred to as failed cells) with spare cells (also, referred to as redundant cells) have been inevitably used to improve the fabrication yield and the quality of the memory devices. Embedded memory devices employed in most of system-on-chips (SOCs) are tested and repaired using separate high cost test apparatuses to increase total fabrication cost of the embedded memory devices. Thus, failure information on the failed cells has been obtained through a built-in self-test (BIST) technique, and the failed cells have been repaired using a built-in self-repair (BISR) circuit. In general, the BISR circuits have been designed to include a complicated logic circuit, for example, a finite state machine (FSM) and to support only standardized self-repair operations for the memory devices. Accordingly, it may be difficult to flexibly deal with design change of hardware of memory systems, for example, change of self-repair schemes of the memory devices.

SUMMARY

According to an embodiment, a semiconductor controller includes a core processor and a built-in self-repair (BISR) logic circuit. The core processor includes a register file with a plurality of register values corresponding to repair commands that control a self-repair operation of a memory device. The BISR logic circuit is configured to receive at least one of the plurality of register values from the core processor and configured to convert the at least one of the plurality of register values into at least one of the repair commands to output the least one of the repair commands to the memory device. The core processor is configured to transmit the at least one of the plurality of register values to the BISR logic circuit in response to a firmware instruction that is output from an external firmware coupled to the memory controller.

According to another embodiment, there is provided a method of operating a memory controller including a core processor in which a register file with a plurality of register values that are identified by respective ones of a plurality of register addresses is disposed and a built-in self-repair (BISR) logic circuit by which a repair command that controls a self-repair operation of a memory device is generated. The method includes transmitting a register value of a start register address, which is designated by a firmware instruction, from the core processor to the BISR logic circuit after the memory device is tested. The register value that is transmitted from the core processor to the BISR logic circuit is converted into the repair command, and the repair command is transmitted to the memory device.

According to yet another embodiment, a memory system includes a memory device and a memory controller. The memory device is configured to perform a self-repair operation in response to a repair command. The memory controller is configured to transmit the repair command to the memory device after the memory device is tested. The memory controller includes a core processor and a built-in self-repair (BISR) logic circuit. The core processor includes a register file with a plurality of register values corresponding to a plurality of repair commands. The BISR logic circuit is configured to receive at least one of the plurality of register values from the core processor and configured to convert the at least one of the plurality of register values into at least one of the repair commands to output the least one of the repair commands to the memory device. The core processor is configured to transmit the at least one of the plurality of register values to the BISR logic circuit in response to a firmware instruction that is output from an external firmware coupled to the memory controller.

BRIEF DESCRIPTION OF THE DRAWINGS

Certain features of the disclosed technology are illustrated by various embodiments with reference to the attached drawings, in which.

DETAILED DESCRIPTION OF THE EMBODIMENTS

In the following description of the embodiments, it will be understood that the terms such as "first" and "second" are intended to identify elements, but not used to define elements or a specific sequence of elements. In addition, when an element is referred to as being "connected" or "coupled" to another element, the element may be electrically or mechanically connected or coupled to the other element directly, or may be electrically or mechanically connected or coupled to the other element indirectly with one or more additional elements therebetween. Moreover, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed. A logic "high" level and a logic "low" level may be used to describe logic levels of electric signals. A signal with a logic "high" level may be distinguished from a signal with a logic "low" level. For example, when a signal with a first voltage corresponds to a signal with a logic "high" level, a signal with a second voltage may correspond to a signal with a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal with a logic "high" level in one embodiment may be set to have a logic "low" level in another embodiment, or vice versa.

Hereinafter, the present teaching will be described in more detail through various embodiments.

Figure 1:
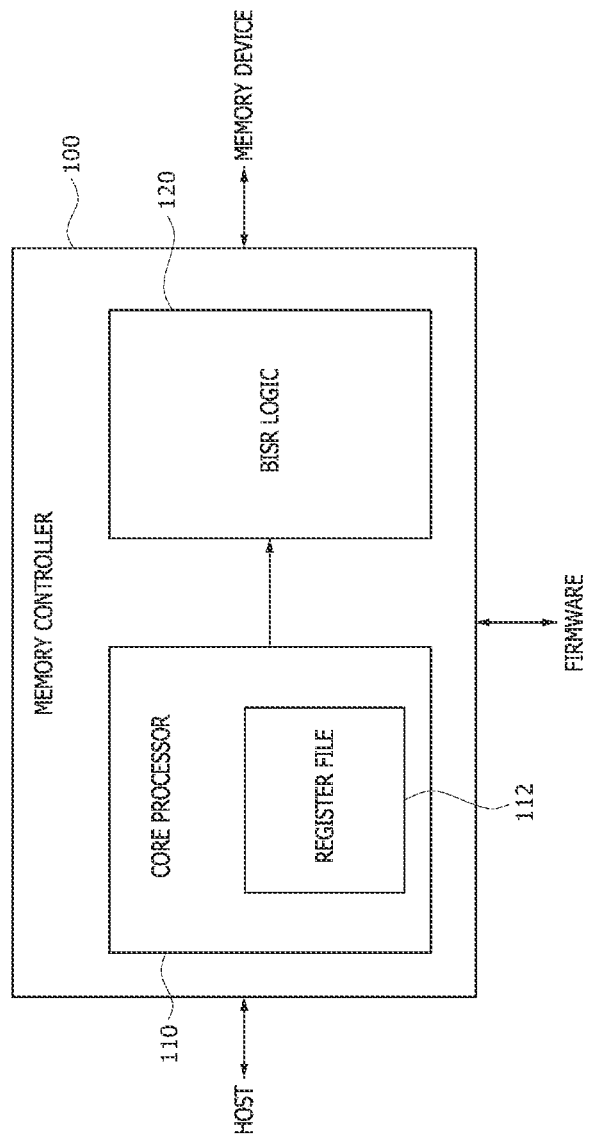
FIG. 1 is a block diagram illustrating a configuration of a memory controller according to an embodiment of the present teaching.

FIG. 1 is a block diagram illustrating a configuration of a memory controller 100 according to an embodiment of the present teaching. Referring to FIG. 1, the memory controller 100 may include a core processor 110 and a BISR logic circuit 120. The memory controller 100 may control a memory device in response to a request that is output from a host. The memory controller 100 may be configured to communicate with an external firmware coupled to the memory controller 100. In an embodiment, the core processor 110 may include a register file 112. The register file 112 may store a plurality of register values. The plurality of register values may correspond to repair commands for a self-repair operation of the memory device, respectively. Descriptions for the register file 112 will be developed in more detail later. The BISR logic circuit 120 may receive at least one of the plurality of register values from the core processor 110. The BISR logic circuit 120 may convert the register values, which are input to the BISR logic circuit 120, into repair commands for requesting a self-repair operation (e.g., a rupture operation) of the memory device. The BISR logic circuit 120 may output the repair commands or command signals corresponding to the repair commands to the memory device.

The core processor 110 may output the register values in response to a firmware instruction that is output from the external firmware. In an embodiment, the firmware may communicate with the core processor 110 through a bus. In another embodiment, the firmware may be disposed in the host or a host controller. Furthermore, register values, among the register values that are stored in the register file 112 of the core processor 110, which are selected by the firmware instruction that is output from the external firmware, may be transmitted to the BISR logic circuit 120. Because the register values that are stored in the register file 112 of the core processor 110 correspond to repair commands which are capable of being recognized to perform the self-repair operation such as a rupture operation of the memory device, the BISR logic circuit 120 may merely allow the register values, which are input to the BISR logic circuit 120, to be converted into the repair commands. Accordingly, a logic circuit (e.g., a finite state machine (FSM)) for directly generating the repair commands for performing a rupture operation of the memory device is not demanded to realize the BISR logic circuit 120 of the memory controller 100. Thus, the BISR logic circuit 120 of the memory controller 100, according to the present embodiment, may be designed to have a simplified configuration as compared with general BISR logic circuits with the FSM.

Figure 2:
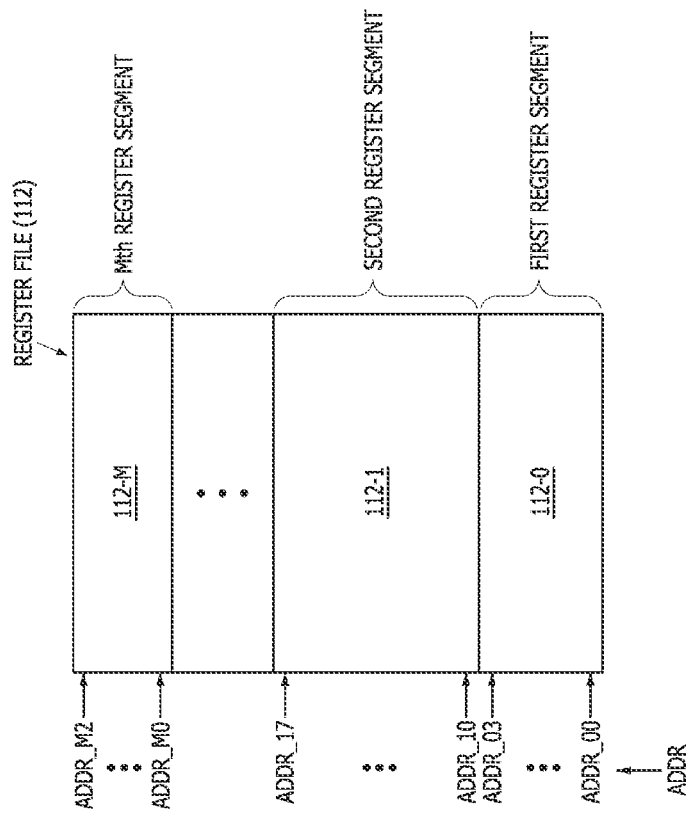
FIG. 2 illustrates a configuration of a register file disposed in a core processor of the memory controller illustrated in FIG. 1.
Figure 3:
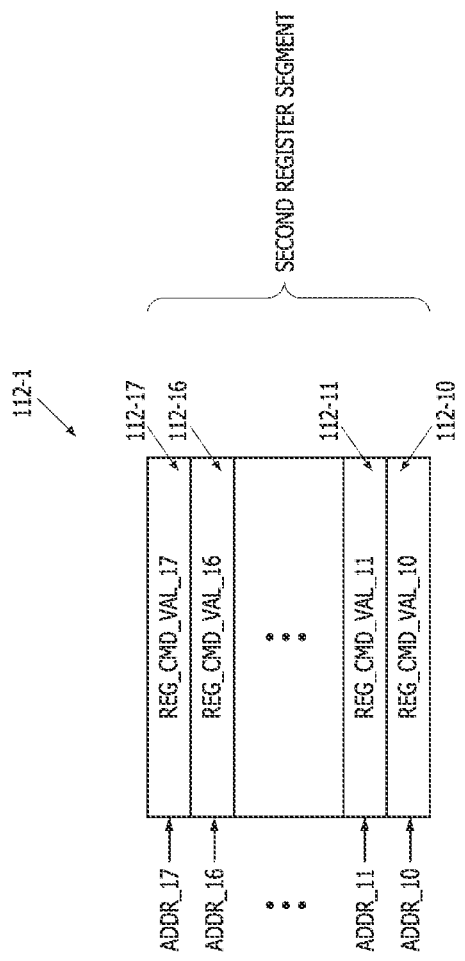
FIG. 3 illustrates a configuration of a register segment included in the register file illustrated in FIG. 2.

FIG. 2 illustrates a configuration of the register file 112 that is disposed in the core processor 110 of the memory controller 100 illustrated in FIG. 1, and FIG. 3 illustrates a configuration of a second register segment 112-2 that is included in the register file 112 illustrated in FIG. 2. First, referring to FIG. 2, the register file 112 may provide a data structure that is comprised of a plurality of register segments (e.g., first to $(M+1)^{th}$ register segments 112-0, 112-1, . . . , and 112-M) (where, "M" is an integer which is greater than zero). The actual size of the register file 112 may be a scalable design parameter. Each of the first to $(M+1)^{th}$ register segments 112-0, 112-1, . . . , and 112-M may include a plurality of physical registers, and each of the plurality of physical registers may store a specific register value. In an embodiment, at least two of the register segments 112-0, 112-1, . . . , and 112-M may include the different numbers of the physical registers.

Each of the physical registers may have a unique address corresponding to a register address ADDR. That is, register addresses ADDRs, which are different from each other, may be allocated to the physical registers, respectively. Thus, the number of the registers that constitute a certain one of the first to $(M+1)^{th}$ register segments 112-0, 112-1, . . . , and 112-M may be equal to the number of register addresses that the certain register segment has. As illustrated in FIG. 2, the first register segment 112-0 may include four register addresses ADDR_00, . . . , and ADDR_03. This means that the first register segment 112-0 may be comprised of four physical registers. The second register segment 112-1 may include eight register addresses ADDR_10, . . . , and ADDR_17. This means that the second register segment 112-1 may be comprised of eight physical registers. The $(M+1)^{th}$ register segment 112-M may include three register addresses ADDR_M0, . . . , and ADDR_M2. This means that the $(M+1)^{th}$ register segment 112-M may be comprised of three physical registers.

In an embodiment, each of the first to (M+1)$^{th}$ register segments 112-0, 112-1, . . . , and 112-M may have register values corresponding to one repair command set which is able to be demanded for the self-repair operation of the memory device. For example, the first register segment 112-0 may have register values corresponding to a first command set, which is required for the rupture operation of the memory device, and the second register segment 112-1 may have register values corresponding to a second command set, which is required for the rupture operation of the memory device. Similarly, the (M+1)$^{th}$ register segment 112-M may also have register values corresponding to a predetermined command set, which is required for the rupture operation of the memory device.

Referring to FIG. 3, the second register segment 112-1 of the register file (112 of FIG. 2) may be comprised of eight registers, that is, first to eighth registers 112-10, . . . , and 112-17. First to eighth register addresses ADDR_10, . . . , and ADDR_17 may be sequentially given to the first to eighth registers 112-10, . . . , and 112-17, respectively. As illustrated in FIG. 3, the first register 112-10 that is designated by the first register address ADDR_10 may have a first register value REG_CMD_VAL_10, and the second register 112-11 that is designated by the second register address ADDR_11 may have a second register value REG_CMD_VAL_11. Similarly, the seventh register 112-16 that is designated by the seventh register address ADDR_16 may have a seventh register value REG_CMD_VAL_16, and the eighth register 112-17 that is designated by the eighth register address ADDR_17 may have an eighth register value REG_CMD_VAL_17. Although not shown in FIG. 3, the third to sixth registers that are sequentially disposed between the second and seventh registers 112-11 and 112-16 may also have third to sixth register values, respectively.

The first to eighth register values REG_CMD_VAL_10, . . . , and REG_CMD_VAL_17 that are stored in respective ones of the first to eighth registers 112-10, . . . , and 112-17 of the second register segment 112-1 may correspond to one repair command set that is required for the self-repair operation (e.g., the rupture operation) of the memory device. For example, it may be assumed that the repair command set corresponding to the first to eighth register values REG_CMD_VAL_10, . . . , and REG_CMD_VAL_17 is a command set for code transmission for setting a mode register set (MRS) in order to perform the self-repair operation of the memory device. In such a case, the first register value REG_CMD_VAL_10 may correspond to a repair command for enabling the code transmission, and the remaining register values may correspond to a repair command for allocating fuses for a post-package repair, a repair command that transmits active information to an array rupture electrical (ARE) fuse array, and the like.

The first to eighth register values REG_CMD_VAL_10, . . . , and REG_CMD_VAL_17 that are stored in respective ones of the first to eighth registers 112-10, . . . , and 112-17 of the second register segment 112-1 may be sequentially transmitted from the core processor 110 to the BISR logic circuit 120 by the firmware instruction that is output from the firmware. That is, the first register value REG_CMD_VAL_10 that are stored in the first register 112-10 that is designated by the first register address ADDR_10 may be transmitted to the BISR logic circuit 120 in response to the firmware instruction, and the second register value REG_CMD_VAL_11 that is stored in the second register 112-11 that is designated by the second register address ADDR_11 may also be transmitted to the BISR logic circuit 120 in response to the firmware instruction. In the same way, the third to eighth register values REG_CMD_VAL_12, . . . , and REG_CMD_VAL_17 that are stored in respective ones of the third to eighth registers 112-12, . . . , and 112-17 that is designated by the third to eighth register addresses ADDR_12, . . . , and ADDR_17 may also be sequentially transmitted to the BISR logic circuit 120 in response to the firmware instruction.

Figure 4:
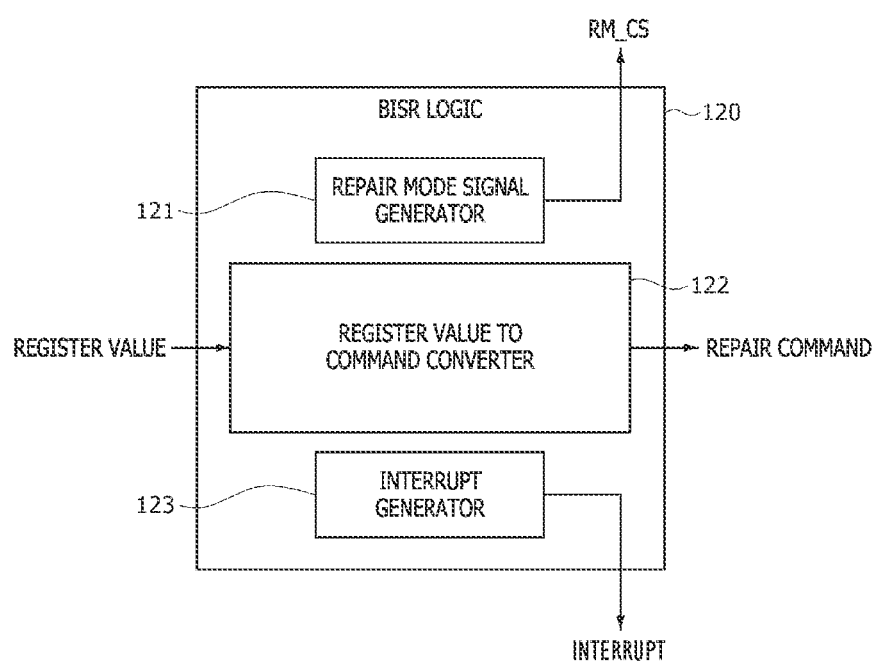
FIG. 4 is a block diagram illustrating a configuration of a BISR logic circuit included in the memory controller illustrated in FIG. 1.

FIG. 4 is a block diagram illustrating a configuration of the BISR logic circuit 120 that is included in the memory controller 100 illustrated in FIG. 1. Referring to FIG. 4, the BISR logic circuit 120 may include a repair mode signal generator 121, a register value-to-command converter 122, and an interrupt generator 123. The repair mode signal generator 121 may generate a repair mode control signal RM_CS. The repair mode control signal RM_CS may be generated to set a signal transmission path from the memory controller 100 to the memory device as a signal transmission path from the BISR logic circuit 120 to the memory device. Thus, when the repair mode control signal RM_CS is generated by the repair mode signal generator 121, a command that is output from the BISR logic circuit 120 may be transmitted to the memory device. The register value-to-command converter 122 may convert the register value that is received from the core processor 110 into the repair command and may output the repair command. The repair command may mean a command, among commands that are necessary for execution of the self-repair operation of the memory device, which corresponds to the register value that is output from the core processor 110. In an embodiment, the register value-to-command converter 122 may include a decoder that decodes the register value to generate the repair command. The interrupt generator 123 may generate an interrupt signal INTERRUPT with information regarding a state of the BISR logic circuit 120 at an appropriate point in time. The interrupt signal INTERRUPT that is generated by the interrupt generator 123 may be transmitted to the firmware.

Figure 5:
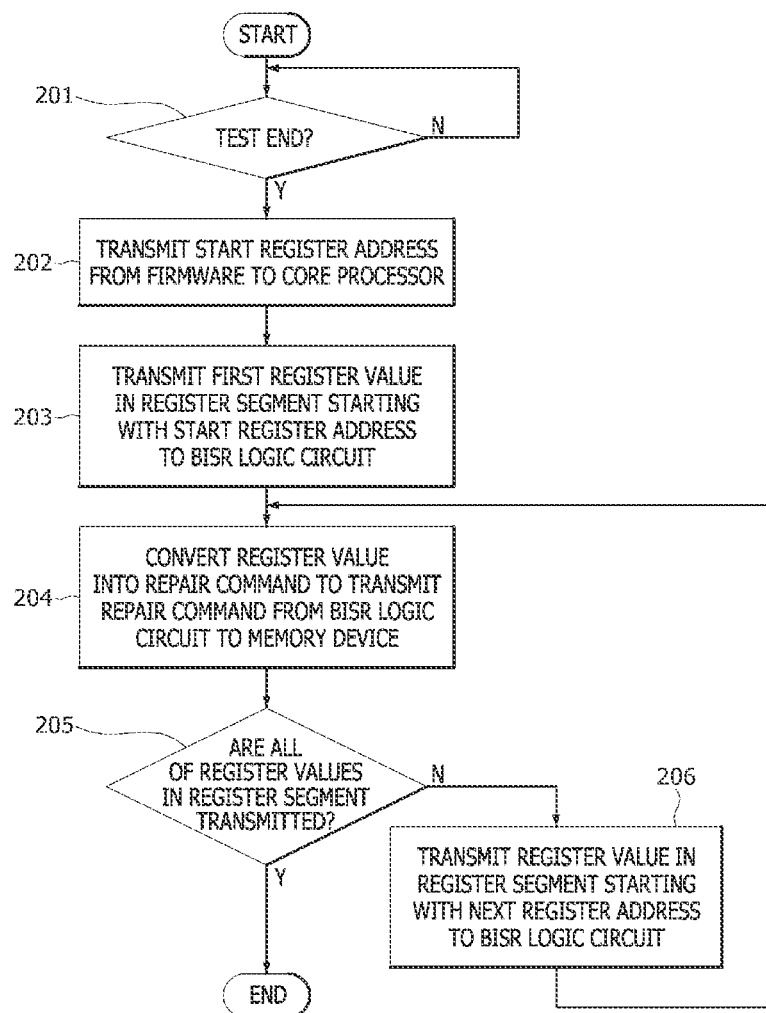
FIG. 5 is a flowchart illustrating an example of an operation of a core processor and a BISR logic circuit included in the memory controller illustrated in FIG. 1.

FIG. 5 is a flowchart illustrating an example of an operation of the core processor 110 and the BISR logic circuit 120 that are included in the memory controller 100, illustrated in FIG. 1. Referring to FIG. 5, whether a test of the memory device ends may be determined at step 201. The determination of step 201 may be executed by checking whether the interrupt signal INTERRUPT is transmitted from a test circuit to the core processor 110 which are included in the memory controller 100. For example, when the test circuit ends a test of the memory device, the test circuit may output the interrupt signal INTERRUPT to the core processor 110. In contrast, when the test circuit does not end a test of the memory device, the test circuit might not output the interrupt signal INTERRUPT to the core processor 110. When the test of the memory device is not ended at step 201 (i.e., the interrupt signal INTERRUPT is not transmitted from the test circuit to the core processor 110), the core processor 110 may maintain a standby state.

When the test ends at step 201, the core processor 110 may receive the start register address from the firmware at step 202. The start register address may be a lowest-order register address of any one of the plurality of register segments that constitute the register file 112 that is included in the core processor 110. At step 203, the core processor 110 may transmit a first register value of a register segment that starts with the start register address to the BISR logic circuit 120. At step 204, the BISR logic circuit 120 may convert the first register value, which is received from the core processor 110, into a first repair command and may output the first repair command to the memory device. The BISR logic circuit 120 may generate the interrupt signal INTERRUPT with information regarding a state in which the BISR logic circuit 120 is capable of receiving a next register value after transmitting the first repair command to the memory device.

At step 205, whether all of the register values in the register segment are transmitted to the BISR logic circuit 120 may be determined. When all of the register values in the register segment are transmitted to the BISR logic circuit 120 at step 205, a BISR operation may terminate. When all of the register values in the register segment are not transmitted to the BISR logic circuit 120 at step 205, a register value that is designated by a next register address may be transmitted to the BISR logic circuit 120 at step 206 and the process may be fed back to step 204. Steps 204, 205, and 206 may be iteratively executed until all of the register values in the register segment are transmitted to the BISR logic circuit 120 and the BISR logic circuit 120 converts all of the register values into repair commands to output the repair commands to the memory device.

Figure 6:
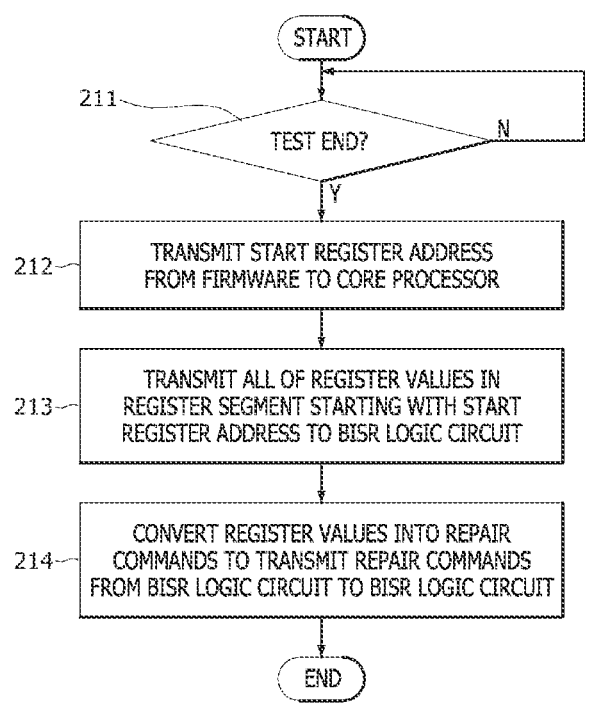
FIG. 6 is a flowchart illustrating another example of an operation of a core processor and a BISR logic circuit included in the memory controller illustrated in FIG. 1.

FIG. 6 is a flowchart illustrating another example of an operation of the core processor 110 and the BISR logic circuit 120 included in the memory controller 100 illustrated in FIG. 1. Referring to FIG. 6, whether a test of the memory device ends may be determined at step 211. The determination of step 211 may be executed by checking whether the interrupt signal INTERRUPT is transmitted from a test circuit to the core processor 110 which are included in the memory controller 100. For example, when the test circuit ends a test of the memory device, the test circuit may output the interrupt signal INTERRUPT to the core processor 110. In contrast, when the test circuit does not end a test of the memory device, the test circuit might not output the interrupt signal INTERRUPT to the core processor 110. When the test of the memory device is not ended at step 201 (i.e., the interrupt signal INTERRUPT is not transmitted from the test circuit to the core processor 110), the core processor 110 may maintain a standby state.

When the test ends at step 211, the core processor 110 may receive the start register address from the firmware at step 212. The start register address may be a lowest-order register address of any one of the plurality of register segments that constitute the register file 112 that is included in the core processor 110. At step 213, the core processor 110 may transmit all of register values of a register segment that starts with the start register address to the BISR logic circuit 120. The core processor 110 may also output a signal, which informs of the number of the register values that are transmitted to the BISR logic circuit 120 and a transmission time interval between repair commands to be transmitted to the memory device, to the BISR logic circuit 120 at step 213. At step 214, the BISR logic circuit 120 may sequentially convert the register values, which are received from the core processor 110, into the repair commands and may output the repair commands to the memory device. The BISR logic circuit 120 may generate the interrupt signal INTERRUPT with information regarding the transmission of the repair commands ending after the repair commands are transmitted to the memory device.

Figure 7:
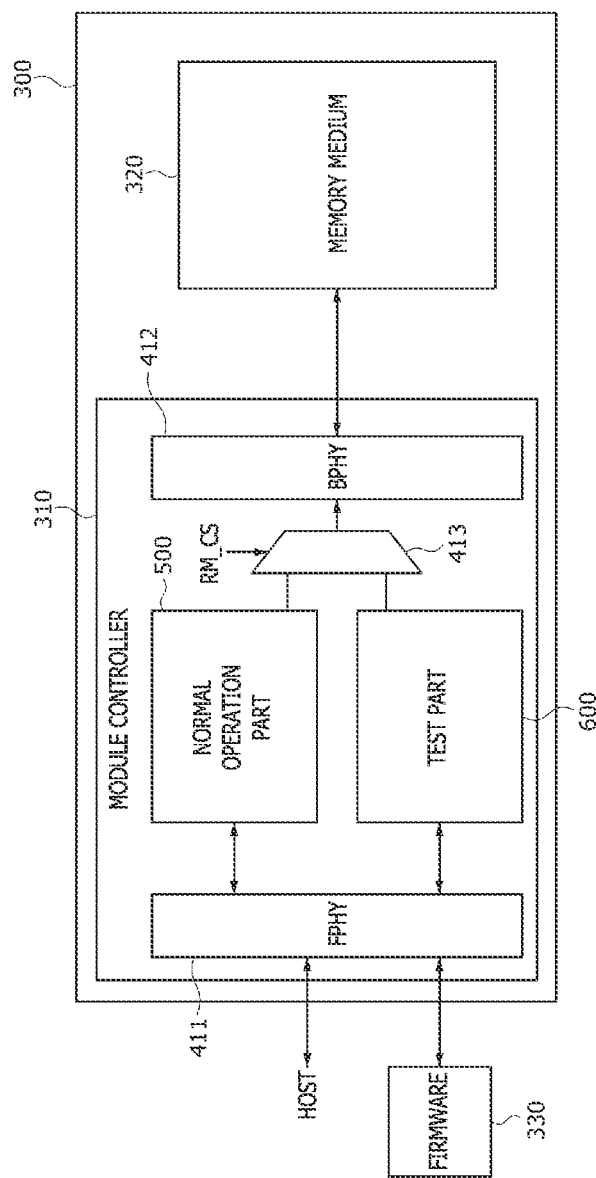
FIG. 7 illustrates a configuration of a memory system according to an embodiment of the present teaching.

FIG. 7 illustrates a configuration of a memory system 300 according to an embodiment of the present teaching. Referring to FIG. 7, the memory system 300 may be a memory module with a module controller 310 and a memory medium 320. Although only one memory medium is illustrated in FIG. 7, the memory system 300 may include a plurality of memory media. The memory system 300 may be configured to communicate with an external firmware 330 coupled to the memory system 300. The module controller 310 may include a front physical layer (FPHY) 411 that acts as an interface between a host and the module controller 310 and a back physical layer (BPHY) 412 that acts as an interface between the module controller 310 and the memory medium 320. The module controller 310 may further include a normal operation part 500, a test part 600, and a signal transmission selector 413.

The signal transmission selector 413 may transmit an output signal of the normal operation part 500 to the memory medium 320 or may transmit an output signal of the test part 600 to the memory medium 320. In an embodiment, the signal selection of the signal transmission selector 413 may be executed by a repair mode control signal RM_CS. For example, when the repair mode control signal RM_CS with a logic "low" level is input to the signal transmission selector 413, the signal transmission selector 413 may select and output the output signal of the normal operation part 500 to the memory medium 320 through the back physical layer 412. In contrast, when the repair mode control signal RM_CS with a logic "high" level is input to the signal transmission selector 413, the signal transmission selector 413 may select and output the output signal of the test part 600 to the memory medium 320 through the back physical layer 412. The normal operation part 500 may have a function of controlling normal operations (e.g., a read operation and a write operation) of the memory medium 320. The test part 600 may have a function of testing the memory medium 320 and transmitting a repair command to the memory medium 320 such that the memory medium 320 performs the self-repair operation according to the test result.

Figure 8:
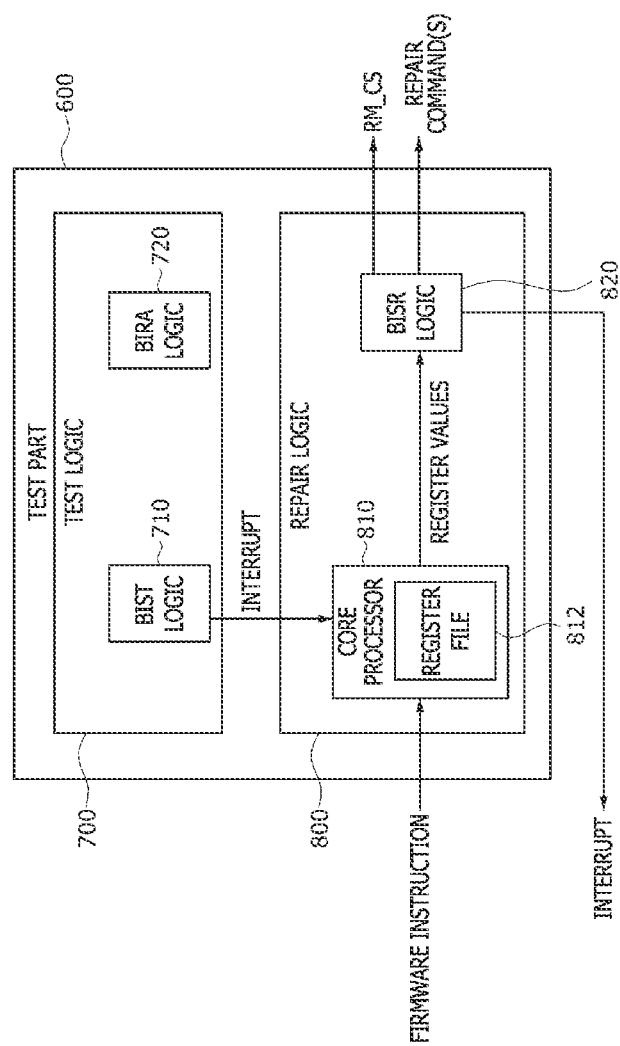
FIG. 8 is a block diagram illustrating a configuration of a test part included in the memory system illustrated in FIG. 7.

FIG. 8 is a block diagram illustrating a configuration of the test part 600 that is included in the memory system 300, illustrated in FIG. 7. Referring to FIG. 8, the test part 600 may include a test logic circuit 700 and a repair logic circuit 800. The test logic circuit 700 may include a BIST logic circuit 710 and a built-in redundancy analysis (BIRA) logic circuit 720. The BIST logic circuit 710 may test the memory medium 320. If a faulty cell is detected while the memory medium 320 is tested, the BIST logic circuit 710 may store a fault address corresponding to an address of the faulty cell in the memory medium 320 into a buffer memory or the like. If a test operation for the memory medium 320 terminates, the BIST logic circuit 710 may generate and transmit an interrupt signal INTERRUPT with information regarding a test end to a core processor 810 of the repair logic circuit 800. The BIRA logic circuit 720 may analyze the fault address of the faulty cell detected during the test operation to perform a redundancy analysis operation for obtaining a repair solution.

The repair logic circuit 800 may include the core processor 810 and a BISR logic circuit 820. The core processor 810 may include a register file 812. The register file 812 may have the same configuration as the register file 112 that is described with reference to FIG. 2. Thus, the register file 812 may have a plurality of register segments. Each of the plurality of register segments may include a plurality of physical registers, and each of the plurality of physical registers may store one register value. Each of the plurality of physical registers may be designated by a register address. The core processor 810 may output at least one register value of any one of the register segments that are included in the register file 812 in response to a firmware instruction. In an embodiment, the core processor 810 may output one register value in response to one firmware instruction. In another embodiment, the core processor 810 may sequentially output all of register values of any one of the register segments in response to one firmware instruction. The register values that are output from the core processor 810 may be transmitted to the BISR logic circuit 820. The BISR logic circuit 820 may convert the register values, which are received from the core processor 810, into repair commands and may transmit the repair commands to the memory medium 320. The BISR logic circuit 820 may have the same configuration as the BISR logic circuit 120 that is described with reference to FIG. 4.

Figure 9:
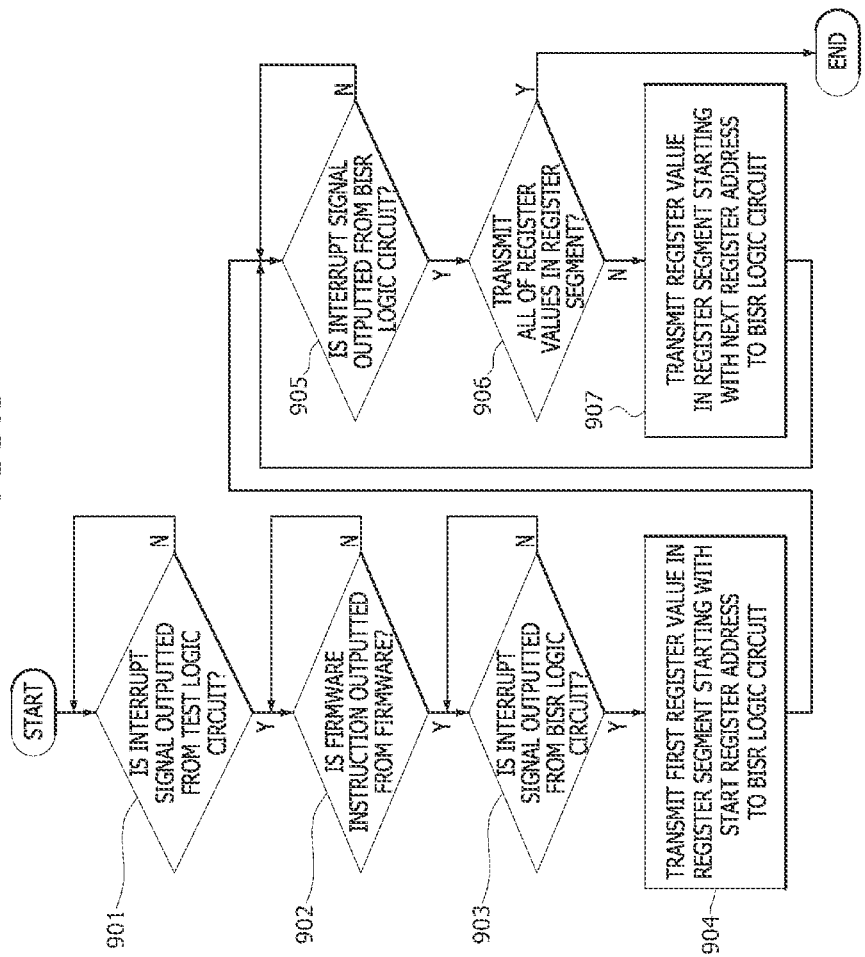
FIG. 9 is a flowchart illustrating an example of an operation of a core processor included in the test part illustrated in FIG. 8.

FIG. 9 is a flowchart illustrating an example of an operation of the core processor 810 included in the test part 800 illustrated in FIG. 8. Referring to FIG. 9, whether the interrupt signal INTERRUPT is output from the test logic circuit 700 (specifically, the BIST logic circuit 710) may be checked at step 901. When the interrupt signal INTERRUPT is output from the BIST logic circuit 710 at step 901, the firmware may transmit the firmware instruction to the core processor 810. The firmware instruction may include the start register address of any one of the plurality of register segments that are included in the register file 812 of the core processor 810. At step 902, the core processor 810 may check whether the firmware instruction is output from the firmware. When the firmware instruction is output from the firmware at step 902, whether a first interrupt signal is output from the BISR logic circuit 820 may be checked at step 903. The first interrupt signal may be an interrupt signal with information regarding the BISR logic circuit 820 in a state in which the BISR logic circuit 820 is capable of receiving a register value after the repair mode control signal RM_CS is transmitted from the BISR logic circuit 820 to the signal transmission selector 413 such that the repair command that is output from the BISR logic 820 is transmitted to the memory medium 320.

When the first interrupt signal is output from the BISR logic circuit 820 at step 903, the core processor 810 may transmit a first register value of a register segment, among the plurality of register segments that are included in the register file 812, starting with the start register address, to the BISR logic 820 at step 904. Thereafter, whether a second interrupt signal is output from the BISR logic circuit 820 may be checked at step 905. The second interrupt signal may be an interrupt signal with information regarding a state in which the BISR logic circuit 820 terminates an operation that transmits the repair command to the memory medium 320. When the second interrupt signal is output from the BISR logic circuit 820 at step 905, whether all of the register values in the register segment are transmitted to the BISR logic circuit 820 may be checked at step 906. When all of the register values in the register segment are transmitted to the BISR logic circuit 820 at step 906, a BISR operation may terminate. When all of the register values in the register segment are not transmitted to the BISR logic circuit 820 at step 906, a register value of a register segment that starts with a next register address may be transmitted to the BISR logic circuit 820 at step 907 and the process may be fed back to step 905. Steps 905, 906, and 907 may be iteratively executed until all of the register values in the register segment that is selected by the firmware instruction are transmitted to the BISR logic circuit 820.

Figure 10:
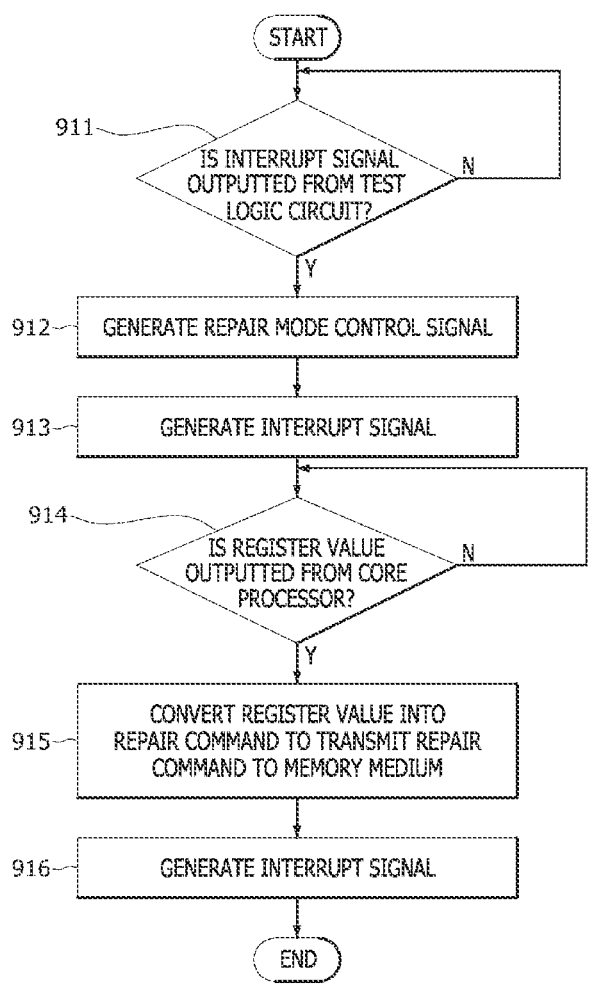
FIG. 10 is a flowchart illustrating an example of an operation of a BISR logic circuit included in the test part illustrated in FIG. 8.

FIG. 10 is a flowchart illustrating an example of an operation of the BISR logic circuit 820 included in the test part 600 illustrated in FIG. 8. Referring to FIG. 10, whether the interrupt signal INTERRUPT is output from the test logic circuit 700 (specifically, the BIST logic circuit 710) may be checked at step 911. When the interrupt signal INTERRUPT is output from the BIST logic circuit 710 at step 911, the repair mode control signal RM_CS may be generated at step 912. The repair command that is output from the BISR logic circuit 820 may be transmitted to the memory medium 320 by the repair mode control signal RM_CS. At step 913, the BISR logic circuit 820 may generate a first interrupt signal with information regarding the BISR logic circuit 820 being in a state in which the BISR logic circuit 820 is capable of receiving a register value. At step 914, the BISR logic circuit 820 may check whether a register value is output from the core processor 810. When the register value is transmitted from the core processor 810 to the BISR logic circuit 820 at step 914, the BISR logic circuit 820 may convert the register value into a repair command to output the repair command to the memory medium 320 at step 915. If the repair command is transmitted to the memory medium 320, the BISR logic circuit 820 may generate a second interrupt signal with information regarding a state in which the BISR logic circuit 820 terminates an operation that transmits the repair command to the memory medium 320 at step 916.

Figure 11:
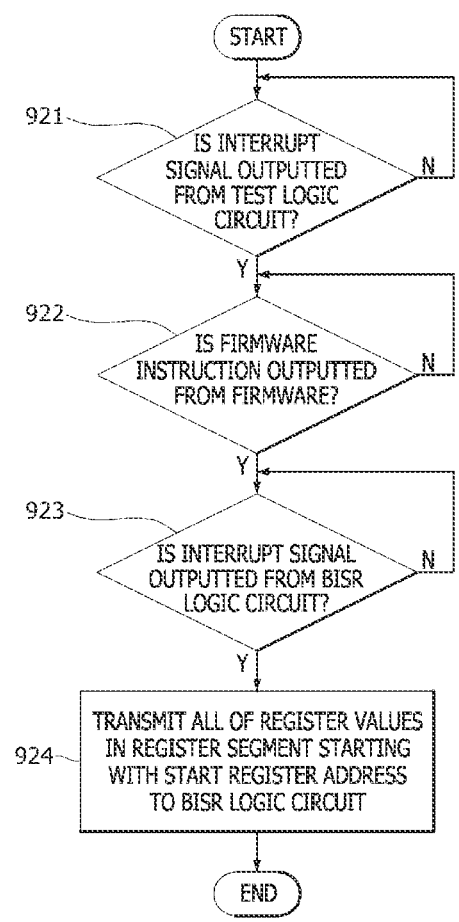
FIG. 11 is a flowchart illustrating another example of an operation of a core processor included in the test part illustrated in FIG. 8.

FIG. 11 is a flowchart illustrating another example of an operation of the core processor 810 included in the test part 600 illustrated in FIG. 8. Referring to FIG. 11, whether the interrupt signal INTERRUPT is output from the test logic circuit 700 (specifically, the BIST logic circuit 710) may be checked at step 921. When the interrupt signal INTERRUPT is output from the BIST logic circuit 710 at step 921, the firmware may transmit the firmware instruction to the core processor 810. The firmware instruction may include the start register address of any one of the plurality of register segments that are included in the register file 812 of the core processor 810. At step 922, the core processor 810 may check whether the firmware instruction is output from the firmware. When the firmware instruction is output from the firmware at step 922, whether a first interrupt signal is output from the BISR logic circuit 820 may be checked at step 923. The first interrupt signal may be an interrupt signal with information regarding the BISR logic circuit 820 being in a state in which the BISR logic circuit 820 is capable of receiving a register value after the repair mode control signal RM_CS is transmitted from the BISR logic circuit 820 to the signal transmission selector 413 such that the repair command that is output from the BISR logic 820 is transmitted to the memory medium 320. When the first interrupt signal is output from the BISR logic circuit 820 at step 923, the core processor 810 may sequentially transmit all of register values of a register segment, among the plurality of register segments that are included in the register file 812, starting with the start register address, to the BISR logic 820 at step 924. At step 924, the core processor 810 may also output a signal with information regarding the number of the register values that are transmitted to the BISR logic circuit 820 and information regarding a transmission time interval between the repair commands to be transmitted to the memory medium 320 to the BISR logic circuit 820 at step 213.

Figure 12:
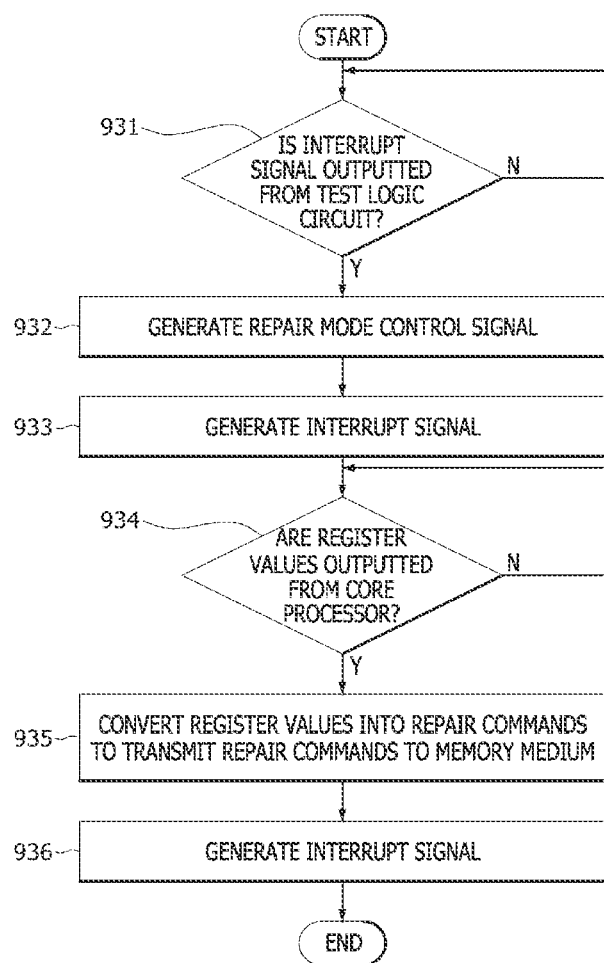
FIG. 12 is a flowchart illustrating another example of an operation of a BISR logic circuit included in the test part illustrated in FIG. 8.

FIG. 12 is a flowchart illustrating another example of an operation of the BISR logic circuit 820 included in the test part 600 illustrated in FIG. 8. Referring to FIG. 12, whether the interrupt signal INTERRUPT is output from the test logic circuit 700 (specifically, the BIST logic circuit 710) may be checked at step 931. When the interrupt signal INTERRUPT is output from the BIST logic circuit 710 at step 931, the repair mode control signal RM_CS may be generated at step 932. The repair command that is output from the BISR logic circuit 820 may be transmitted to the memory medium 320 by the repair mode control signal RM_CS. At step 933, the BISR logic circuit 820 may generate a first interrupt signal that provides information with regard to the BISR logic circuit 820 being in a state in which the BISR logic circuit 820 is capable of receiving a register value. At step 934, the BISR logic circuit 820 may check whether register values are output from the core processor 810. When the register values are transmitted from the core processor 810 to the BISR logic circuit 820 at step 934, the BISR logic circuit 820 may sequentially convert the register values into repair commands and may output the repair commands to the memory medium 320 at step 935. If all of the repair commands are transmitted to the memory medium 320, the BISR logic circuit 820 may generate a second interrupt signal with information regarding a state in which the BISR logic circuit 820 terminates an operation that transmits the repair commands to the memory medium 320 at step 936.

Figure 13:
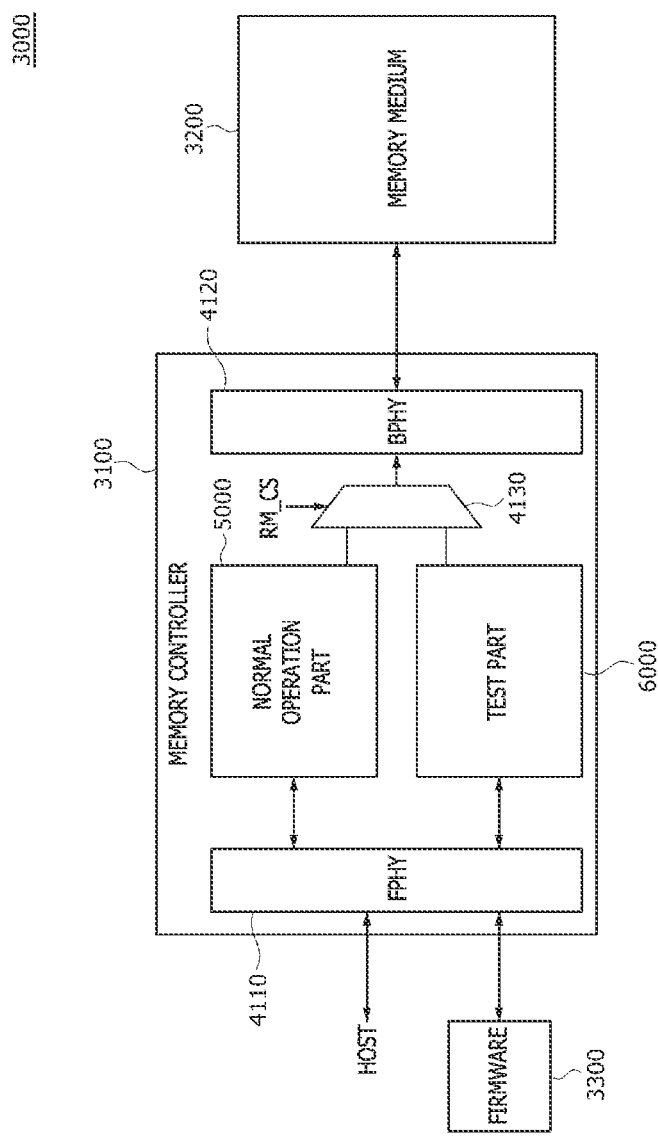
FIG. 13 illustrates a configuration of a memory system according to another embodiment of the present teaching.

FIG. 13 illustrates a configuration of a memory system 3000 according to another embodiment of the present teaching. Referring to FIG. 13, the memory system 3000 may include a memory controller 3100, a memory medium 3200, and a firmware 3300. The memory controller 3100 may be configured to communicate with the firmware 3300. The memory controller 3100 may include a front physical layer (FPHY) 4110 acting as an interface between a host and the memory controller 3100 and a back physical layer (BPHY) 4120 acting as an interface between the memory controller 3100 and the memory medium 3200. The memory controller 3100 may further include a normal operation part 5000, a test part 6000, and a signal transmission selector 4130. The only difference between the memory system 3000, illustrated in FIG. 13, and the memory system 300, illustrated in FIG. 7, is that the memory controller 3100 and the memory medium 3200 included in the memory system 3000 are independently disposed without constituting one module while the module controller 310 and the memory medium 320 included in the memory system 300 are disposed to constitute one module. Accordingly, the memory system 3000 may perform substantially the same operation as described with reference to FIGS. 7 to 12.

Figure 14:
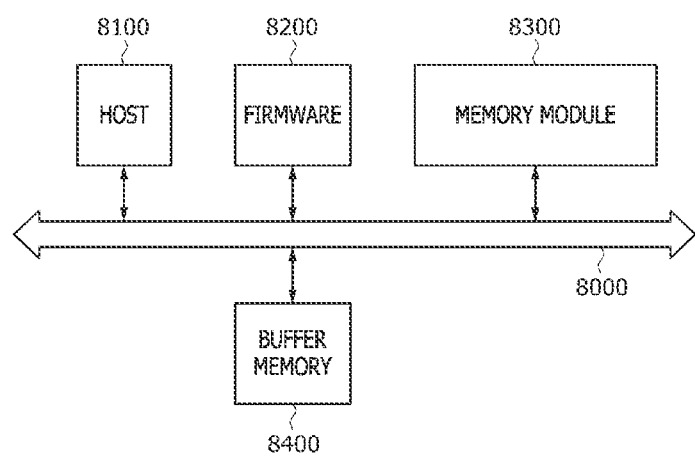
FIG. 14 illustrates a configuration of a memory system according to yet another embodiment of the present teaching.

FIG. 14 illustrates a configuration of a memory system according to yet another embodiment of the present teaching. Referring to FIG. 14, the memory system according to the present embodiment may include a host 8100, a firmware 8200, a memory module 8300, and a buffer memory 8400 which are configured to communicate with each other through a system bus 8000. The memory module 8300 may be realized to have the same configuration as the memory system 300, which is described with reference to FIG. 7, having a memory module structure. The buffer memory 8400 may have a function of storing fault addresses of faulty cells detected while the memory module 8300 is tested.

Figure 15:
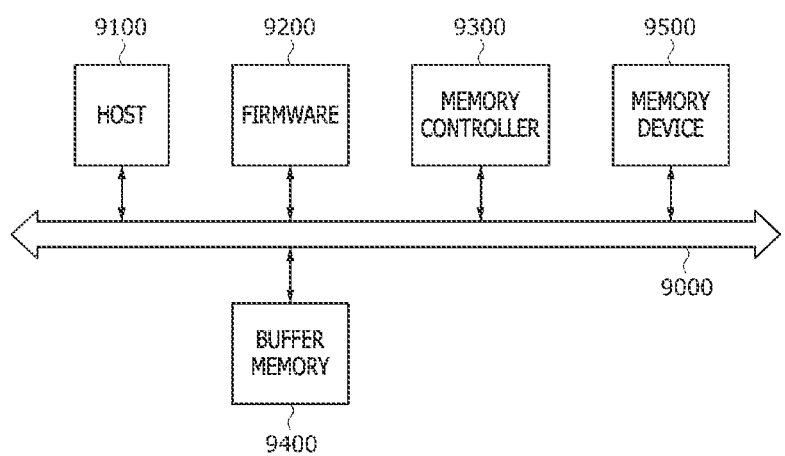
FIG. 15 illustrates a configuration of a memory system according to still another embodiment of the present teaching.

FIG. 15 illustrates a configuration of a memory system according to still another embodiment of the present teaching. Referring to FIG. 15, the memory system according to the present embodiment may include a host 9100, a firmware 9200, a memory controller 9300, a buffer memory 9400, and a memory device 9500 which are configured to communicate with each other through a system bus 9000. The memory controller 9300 may be realized to have the same configuration as the memory controller 3100 which is described with reference to FIG. 13. The buffer memory 9400 may have a function of storing fault addresses of faulty cells that are detected while the memory device 9500 is tested by the memory controller 9300.

According to various embodiments described above, there may be provided a memory controller including a BISR logic circuit that has a relatively simplified logic configuration to flexibly deal with design change of hardware of memory systems, a method of operating the memory controller, and a memory system including the memory controller.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory controller comprising:
   a core processor including a register file with a plurality of register values corresponding to repair commands that control a self-repair operation of a memory device; and
   a built-in self-repair (BISR) logic circuit configured to receive at least one of the plurality of register values from the core processor and configured to convert the at least one of the plurality of register values into at least one of the repair commands to output the at least one of the repair commands to the memory device,
   wherein the core processor is configured to transmit the at least one of the plurality of register values to the BISR logic circuit in response to a firmware instruction that is output from an external firmware coupled to the memory controller.

2. The memory controller of claim 1, wherein the plurality of register values that are stored in the register file correspond to the repair commands for the self-repair operation of the memory device, respectively.

3. The memory controller of claim 1,
   wherein the register file includes a plurality of register segments;
   wherein each of the plurality of register segments includes a plurality of physical registers; and
   wherein each of the plurality of physical registers stores a specific register value.

4. The memory controller of claim 3, wherein the register values that are stored in each of the plurality of register segments correspond to one repair command set for the self-repair operation of the memory device.

5. The memory controller of claim 3, wherein each of the plurality of physical registers is configured to be designated by a unique register address.

6. The memory controller of claim 5, wherein the core processor is configured to sequentially transmit the register values in a register segment, among the plurality of register segments, which starts with a register address that is selected by the firmware instruction, to the BISR logic circuit.

7. The memory controller of claim 1, wherein the BISR logic circuit includes a register value-to-command converter that converts the at least one register value that is output from the core processor into the at least one repair command to output the least one repair command.

8. The memory controller of claim 7, wherein the BISR logic circuit further includes:
- a repair mode signal generator configured to generate a repair mode control signal for designating a signal transmission path through which the repair command is transmitted from the BISR logic circuit to the memory device; and
- an interrupt generator configured to generate an interrupt signal with information regarding a state of the BISR logic circuit.

9. The memory controller of claim 8, wherein the BISR logic circuit is configured to generate a first interrupt signal with information regarding the BISR logic circuit being in a state in which the BISR logic circuit is capable of receiving the register value after the repair mode control signal is generated.

10. The memory controller of claim 8, wherein the BISR logic circuit is configured to generate a second interrupt signal with information regarding a state in which the BISR logic circuit terminates an operation that transmits the repair command to the memory device after transmitting the repair command to the memory device.

11. The memory controller of claim 1, wherein the core processor is configured to output one of the plurality of register values in response to the firmware instruction.

12. The memory controller of claim 1, wherein the core processor is configured to output the plurality of register values in response to the firmware instruction.

13. The memory controller of claim 12, wherein the core processor is configured to output a signal, which informs about the number of the register values that are transmitted to the BISR logic circuit and a transmission time interval between the repair commands to be transmitted to the memory device, to the BISR logic circuit while the register values are transmitted to the BISR logic circuit.

14. A method of operating a memory controller including a core processor in which a register file with a plurality of register values that are identified by respective ones of a plurality of register addresses is disposed and a built-in self-repair (BISR) logic circuit by which a repair command that controls a self-repair operation of a memory device is generated, the method comprising:
- transmitting a register value of a start register address that is designated by a firmware instruction from the core processor to the BISR logic circuit after the memory device is tested; and
- converting the register value that is transmitted from the core processor to the BISR logic circuit into the repair command to transmit the repair command to the memory device.

15. The method of claim 14, wherein the firmware instruction is transmitted from an external firmware to the core processor in response to an interrupt signal that is generated when a test operation for the memory device terminates.

16. The method of claim 14,
wherein the register file is comprised of a plurality of register segments, each of which includes a plurality of physical registers;
wherein the plurality of register values are stored in the plurality of physical registers, respectively; and
wherein the method further includes sequentially transmitting the register values of the register segment from the core processor to the BISR logic circuit until a register value of a last register address of a certain register segment is transmitted to the BISR logic circuit when all of the register values in the certain register segment with a physical register, starting with the start register address, are not transmitted.

17. The method of claim 16, wherein each of the register values is transmitted from the core processor to the BISR logic circuit in response to the firmware instruction.

18. The method of claim 14,
wherein the register file is comprised of a plurality of register segments, each of which includes a plurality of physical registers;
wherein the plurality of register values are stored in the plurality of physical registers, respectively; and
wherein all of the plurality of register values in the register segment with the physical register, starting with the start register address, are sequentially transmitted from the core processor to the BISR logic circuit in response to the firmware instruction.

19. The method of claim 18, further comprising transmitting a signal, which informs about the number of the register values that are transmitted to the BISR logic circuit and a transmission time interval between the repair commands to be transmitted to the memory device, from the core processor to the BISR logic circuit.

* * * * *